Feb. 2, 1965 W. M. WEPFER ETAL 3,167,926

THERMOELECTRIC APPARATUS

Filed Dec. 20, 1963

INVENTORS
William M. Wepfer
and Cecil J. Mole
BY [signature]
ATTORNEY

United States Patent Office 3,167,926
Patented Feb. 2, 1965

3,167,926

THERMOELECTRIC APPARATUS

William M. Wepfer, Pittsburgh, and Cecil J. Mole, Monroeville, Pa., assignors to Westinghouse Electric Corporation, East Pittsburgh, Pa., a corporation of Pennsylvania Filed Dec. 20, 1963, Ser. No. 332,010
6 Claims. (Cl. 62—3)

Figure 1:
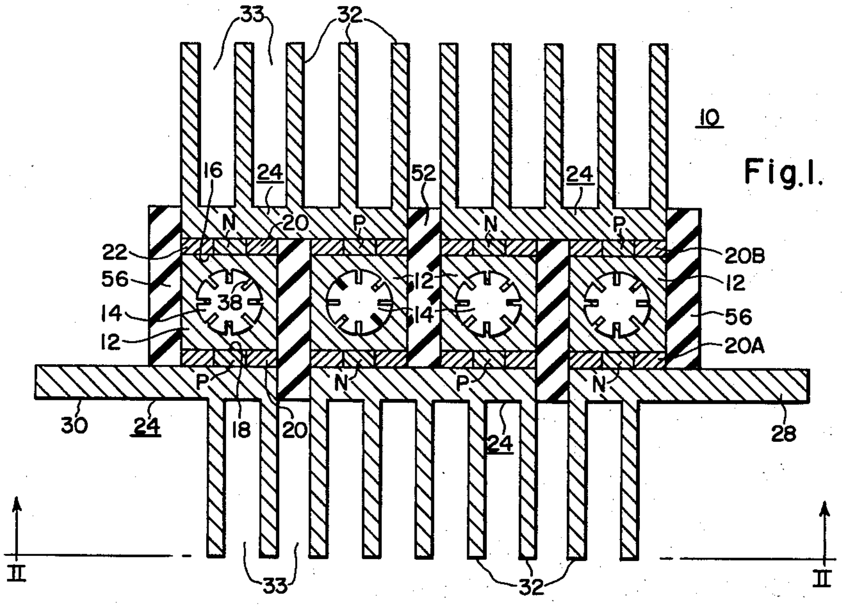

This invention is related generally to thermoelectric apparatus and more particularly to the construction of a new and efficient liquid to air device for varying the temperature of one of the fluid media, or for producing through the use of thermoelectric effects electrical power.

In our copending application Serial No. 320,160, filed October 30, 1963, entitled Thermoelectric Heat Pumping Apparatus, and assigned to the present assignee, there is described in detail a thermoelectric heat exchange device utilizing a novel approach or principle for obtaining high efficiency at relatively low cost and utilizing relatively small amounts of thermoelectric material. The principle of operation of the above device is known as "direct transfer," that is, there is provided a heat flow path in the thermoelectric apparatus having no electrical or heat insulation therein, so that substantially all of the cooling effects produced at the thermoelectric cold junctions are transferred to the cooled medium of the thermoelectric heat exchanger. In the aforementioned copending application, there was described specifically a thermoelectric heat exchanger of the liquid-to-liquid type. In the present invention, there is provided a thermoelectric heat exchanger construction of the liquid to gas (i.e. air) type which is utilized in certain applications for the direct heating or cooling of air rather than necessitating an intermediate heat exchanger for the latter purpose.

Within the contemplation of this invention, there is also the provision of a liquid to air electrical power producing apparatus utilizing thermoelectric material for the direct production of electricity. It will be appreciated that for certain applications, there is readily available a source of relatively cool air or relatively hot liquid, for example in the polar regions where arctic air is available, the use of a thermoelectric device of the air to liquid type for the production of electricity becomes extremely convenient.

Accordingly, it is an object of this invention to provide a new and improved thermoelectric heat exchanger having no electrical insulation in the heat flow path and being of the liquid to air type.

Still another object of this invention is to provide a new and improved thermoelectric generating device of the liquid to air type which promotes the efficient generation of electrical power.

A still further object of this invention is to provide a new and improved thermoelectric generation device of the liquid to air type having no insulation in the heat flow path between the thermoelectric junctions and the heat source and heat sink, respectively.

A still further object of this invention is to provide a new and improved liquid to air thermoelectric temperature varying device having no electrical insulation in the heat flow path between the heat source, heat sink and the thermoelectric junctions thereof.

Briefly, the present invention accomplishes the above cited objects by providing a liquid to gas thermoelectric construction or thermopile wherein there is provided a liquid flow circuit disposed intermediate a pair of gaseous or air flow circuits. The liquid flow circuit may comprise a plurality of serially connected passageways formed in conductive members disposed between adjacent layers of thermoelectric material and with adjacent passageways being connected in series by coupling elements or conduits formed from materials having high electrical resistance. The gaseous flow path means are formed desirably from electrically conducting material and can comprise for example heat exchange fins which serve not only to vary the temperature of the gas flowing therepast, but also as conductive members to conduct electricity between adjacent stages of the thermopile. With this construction, there is provided a current flow path in the thermoelectric arrangement which extends substantially sinusoidally throughout the thermopile to produce heating and cooling by the thermoelectric pellets for the purpose of varying the temperature of the liquid and gas in the heat exchangers. The insulating coupling members serve to isolate electrically adjacent portions of the thermopile from one another, resulting in the sinusoidal current flow path which prevents the bypassing of any of the thermoelectric pellets.

As used herein the term "thermoelectric junction" is used to define the boundary between or plane of joinder of a layer of thermoelectric material and an electrically conductive member to which the thermoelectric layer is secured (e.g., a fin or a block member).

In accordance with the invention, all materials intermediate the heat exchangers and the hot and cold junctions of the thermoelectric material are electrically conductive and therefore also are relatively good thermal conductors. As a result, there is provided no electrical insulation in the heat flow path of the thermopile which insulation is normally undesirable from the thermal conductivity standpoint. With this construction, it will therefore be appreciated that extremely high coefficient of performance can be achieved from the thermopile, resulting in thermoelectric devices of relatively low cost, as has been explained in connection with the theory of direct transfer in our aforementioned copending application.

In addition, the present invention contemplates the provision of an electrical generation device of the gas to liquid type wherein the "direct transfer " approach results in the provision of an electrical generator of high capabilities and efficiencies.

Further objects and advantages of this invention and features of novelty which characterize the invention will be pointed out in particularity in the claims annexed to and forming a part of this specification.

Figure 2:
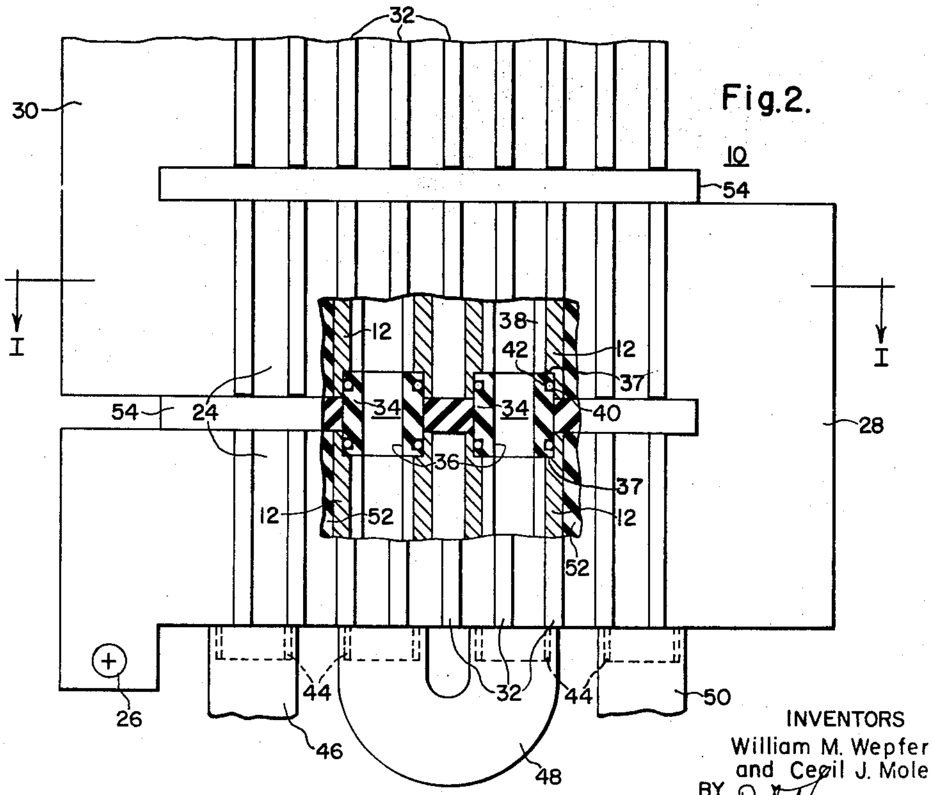

For a better understanding of this invention, reference may be had to the accompanying drawings, in which:

FIGURE 1 is a sectional view of a gas to liquid thermoelectric heat exchange apparatus embodying the principles of this invention and taken along the lines I—I of FIG. 2; and FIG. 2 is an elevational view of the apparatus shown in FIG. 1, having portions thereof broken away for clarity, and taken along the lines II—II of FIG. 1.

Referring now to the apparatus illustrated in FIGS. 1 and 2, it will be seen that the thermopile 10, constructed in accordance with the principles of this invention includes a plurality of heat conductive block members or modules 12 formed from electrically and thermally conductive material such as copper or aluminum. Each of the blocks 12 includes a flow opening 14 formed therein and extending parallel to a pair of opposed sides 16 and 18. On each of the opposed sides 16 and 18, there is mounted thermoelectric material designated generally by the reference character 20, with the layers 20 being formed from a plurality of pellets 22. Each of the pellets 22 is constructed from suitable thermoelectric material, such as bismuth telluride and desirably is secured to the respective surfaces 16 and 18 by suitable securing means such as by brazing.

Each of the layers of thermoelectric material 20 are formed from either thermoelectrically positive or thermoelectrically negative materials in such a manner wherein a current flow path is formed in thermopile 10 with the current flow path having thermoelectrically positive and thermoelectrically negative material therein in an alternating sequence. Accordingly, as current passes from thermoelectrically positive material to thermoelectrically negative material, heating of the structure intermediate the positive and negative thermoelectric materials is produced. Similarly, as current passes from thermoelectrically negative to thermoelectrically positive material, a cooling effect takes place in the structure between the layers of thermoelectric material.

For use of the thermopile 10 as a heating or cooling device, it is necessary to pass electrical current through the thermopile, and in this example of the invention electrical current is passed in series through each of the thermoelectric pellet layers 20 to produce localized cooling and heating in an alternate manner at certain areas within the thermopile 10. In order to provide a current flow path through the thermoelectric device 10, there are mounted on the sides of the pellets 22 opposite the surfaces 16 and 18 of the module blocks 12 electrical conductors designated generally by the reference character 24. The conductors 24 serve to bridge adjacent thermoelectric layers in the series current flow path. It will be appreciated that the current flow path through the thermopile 10 desirably starts with a terminal 26 (FIG. 2) and then extends transversely (from left to right as viewed in FIG. 2) across the thermopile 10 in a sinusoidal manner (viewing FIG. 1) wherein the current passes through each of the bridging conductors 24, thermoelectric layers 20 and module blocks 12. At the end of a transverse path through the thermopile 10, there is provided a generally U-shaped bridging member 28 (FIG. 2) which connects electrically the first transversely extending group of thermoelectric modules to the next transverse group of thermoelectric modules. As FIG. 1 is a sectional view through the second transverse group of thermoelectric modules of the thermopile 10, it will be appreciated that the current passes from the U-shaped bridging connector 28 through the lower thermoelectric layer 20A through the right hand (FIG. 2) electrically conducting module 12, then through the upper thermoelectric layer 20B to the right hand upper conducting strap 24 of FIG. 1, and thence through the remainder of the thermoelectric layers 20, modules 12 and connector straps 24 until the current flow path reaches still another U-shaped connecting conductor 30, which connects the current flow path from the second transverse group of modules 12 to the third transverse group of modules, and so forth throughout the entire thermoelectric device.

Each of the bridging conductors 24 desirably is provided with a plurality of laterally extending heat exchange fins 32 thereon which fins are connected thermally to adjacent ones of the thermoelectric layers 20 so that each of the fins 32 is either cooled or heated by the thermoelectric effects in accordance with the polarity of the current and the polarity of the thermoelectric material.

In this specific example of the invention, it is desirable for the cooling effect to take place in the fins 32 of the thermopile and the thermoelectric heating effect be concentrated within the module blocks 12 so that fluid passing through the opening 14 in the module blocks 12 will be heated.

In accordance with the invention, each of the module blocks 12 of adjacent transverse groups of modules is formed so that its openings 14 are disposed in alignment with corresponding openings 14 of adjacent blocks. Each of the openings 14 extend laterally with respect to the current flow path of the thermopile 10 and the continuity of the openings 14 is preserved to form a single heated fluid flow path by means of conduit members 34 (FIG. 2). Each of the conduits 34 desirably is formed from insulating material, such as a resinous insulating material, and having the central openings 36 thereof disposed in alignment with the openings 14 of the module blocks 12. The tubular conduits 34 are closely received within an enlarged concentric offset portion 37 disposed in adjacent ends of adjacent blocks 12. The flow passages 14 are coupled by the conduits 34 to prevent leakage of fluid flowing therethrough. In furtherance of this purpose, sealing means are provided intermediate the conduits 34 and the offset portions 37 of the modules 12. One means for sealing the flow passages 14 is illustrated herein as a pair of O-rings 40 mounted in recesses 42 formed in the members 34.

Each of the end ones of the blocks 12 such as the lowermost blocks 12 of FIG. 2 desirably are provided with integral tubulations formed thereon extending outwardly therefrom in alignment with the openings 14 and designated generally by the reference characters 44. The left hand tubulation 44 of FIG. 2 desirably is coupled to a conduit 46 desirably connected to a source of liquid (not shown). Each of the groups of flow openings 14 is desirably connected in series to provide a single continuous flow path for the heated fluid. The latter flow path includes the inlet 46 connected to the left hand group (moving from front to back as viewed in FIG. 2) of openings 14. A conduit (not shown) connects the left hand group of openings 14 with the next adjacent group of openings. A front connection is made between the latter group of openings with the group of openings 14 forming the third from the left group, by a generally U-shaped conduit 48, of insulating material, connected to the tubulations 44 of the frontwardly facing modules 12. A rearward connection (not shown) is made between the third from the left group of openings 14 and the right hand group of openings (FIG. 2) and an exit conduit is formed by a tubular connector 50 to complete the heated fluid flow path through the thermoelectric device 10.

It will be appreciated that insulating means must be utilized with the thermopile 10 in order to provide the sinusoidal series flow path of electrical current through the thermopile 10. One such insulating means has already been described and comprises the tubular members 34 which serve to insulate adjacent module blocks forming the heated fluid flow path. In addition, there is desirably provided insulating means designated by the reference character 52 extending from the front of the thermopile 10 to the rear thereof and serving to isolate electrically adjacent modules 12 and adjacent ones of the bridging members 24. Laterally extending insulating material 54 is provided between adjacent rows of modules 12 and include openings formed therein to receive the insulating tubular members 34. The latter members may also include extensions shaped complementary to the shape of the fins 32 to prevent electrical arcing between adjacent fins. Peripheral arcing along the curret flow path is also desirably prevented by side members of insulation 56. The insulating means 52, 54 and 56 desirably is formed from sheet material and may comprise any suitable resinous sheet material serving to prevent short circuiting of any portion of the sinusoidal current flow path of the thermopile 10.

It will be seen that the thermal flow path of the thermopile 10 extends from the layers 20 of thermoelectric material directly to either the fins 32 or the flow passages 14. There is no provision in the thermal flow path of electrical insulating material so that the thermopile 10 produces a "direct transfer" of heat from the thermoelectric material 20 to the heated and cooled fluids.

It will be further seen that the thermopile 10 when acting as a cooling or air conditioning device desirably is formed with the thermoelectric material 22 and the direction of current flow selected to produce heating of fluid in the module blocks 12 and the cooling of air passing in heat exchange relationship with the fins 32. In the event the heated fluid comprises a liquid, it is to be realized that it is desirable to promote the heat transfer between the module blocks 12 and the liquid flowing through the passageways 14. In furtherance of this purpose, each of the passageways 14 desirably is provided with a plurality of inwardly extending circumferentially spaced fins 38 which serve to increase the heat transfer surface to which the liquid is exposed and also to promote mixing of the liquid as it flows through the passageways 14.

In using the thermopile 10 as an air conditioning device, it will be appreciated that the fins 32 serve as only an illustrative example of coolant means for cooling air. Normally air will be passed through the openings 33 between adjacent fins 32 by suitable means such as a blower, not shown. To increase the heat transfer between the fins 32 and the air flowing in spacers 33, fins 32 may be formed to implement the increase in heat transfer area thereof. One example of a construction to increase the heat transfer area is the provision of laterally extending vanes formed in each of the openings 33 and joined to adjacent fins 32 of each heat exchanger 24.

It must be realized, of course, that the thermopile 10 may also be utilized as an electrical generating device. In certain applications, there is provided a source of relatively cool air and a source of a warmer liquid. Accordingly, means may be provided for passing the cool air to heat exchange relationship with the fins 32 and for passing the relatively warmer liquid through the flow passages 14 of the thermopile 10. Under this circumstance, electrical current will be generated by the thermoelectric layers 20 to produce a potential difference across the terminals of the thermopile 10. Such an electrical generator will retain the advantages and features of the "direct transfer" arrangement of this invention to produce an extremely efficient thermoelectric current generating device.

It will be further realized that the thermopile 10 may be utilized as a heating apparatus for air wherein the direction of current flow and the polarity of the thermoelectric layers 20 are chosen to promote cooling in the module blocks 12 and heating of air flowing passed the fins 32.

It will be appreciated that many modifications and departures from the embodiment of this invention described above may be made without departing from the broad spirit and scope of this invention. Accordingly, it is specifically intended that the thermopile arrangement shown and described herein be interpreted as illustrative of this invention, rather than as limitative thereof.

We claim as our invention:

1. In a thermoelectric device, a pair of spaced modules formed from electrically and thermally conductive material, a layer of thermoelectric material secured to a surface of each of said modules, a heat exchange means including a plurality of electrically conducting fins thereon mounted in bridging relationship between said layers of thermoelectric material whereby a series current flow path is formed through said heat exchange means, said thermoelectric layers and said modules, each of said modules having a passageway formed therein and conduit means formed from insulating material connecting said passageways in series.

2. In a thermoelectric device, an electrically and thermally conductive module, a pair of layers of thermoelectric material mounted on opposed sides of said module, one of said layers being formed from thermoelectrically positive material and the other of said layers being formed from thermoelectrically negative material, said module having a liquid flow passageway formed therein extending substantially parallel to said module sides, a plurality of heat exchange fins secured to each of said thermoelectric layers, terminal means connected to said heat exchange fins for passing current serially through said fins, said thermoelectric layers and through said module.

3. In a thermoelectric device, an electrically and thermally conductive module, a pair of layers of thermoelectric material mounted on opposed sides of said module, one of said layers being formed from thermoelectrically positive material and the other said layers being formed from thermoelectrically negative material, said module having a liquid flow passageway formed therein extending substantially parallel to said module sides, a plurality of heat exchange fins secured to each of said thermoelectric layers, terminal means connected to said heat exchange fins for passing current serially through said fins, said thermoelectric layers and through said module, said flow passageway comprising a bore through said module, and means mounted in said bore for increasing the heat transfer surface of the walls of said passageway.

4. In a thermoelectric device, the combination comprising a first electrically and thermally conductive module having a first and second surface formed on opposed sides thereof, a second electrically and thermally conductive module having a first and a second surface formed on opposed sides thereof, a third electrically and thermally conductive module having a first and a second surface formed on opposed sides thereof, a fourth electrically and thermally conductive module having a first and a second surface formed on opposed sides thereof, a plurality of layers of thermoelectrically positive material mounted on said first surface of said first module, said second surface of said second module, said first surface of said third module, and said second surface of said fourth module, respectively; a plurality of layers of thermoelectrically positive material mounted on said second surface of said first module, said first surface of said second module, said second surface of said third module, and said first surface of said fourth module, respectively; a first group of electrically conductive heat exchange fins mounted on said thermoelectric layer disposed on said second surface of said first module; a second group of electrically conducting heat exchange fins mounted in bridging relationship between said layer of thermoelectric material disposed on said first surface of said first module and said layer of thermoelectric material mounted on said first surface of said second module; a third group of heat exchange fins formed from electrically conductive material mounted in bridging relationship between said layer of thermoelectric material disposed on said second surface of said second module and said layer of thermoelectric material disposed on said second surface of said third module; a fourth group of electrically conductive heat exchange fins mounted in bridging relationship between said layer of thermoelectric material disposed on said first surface of said third module and said layer of thermoelectric material mounted on said first surface of said fourth module; a fifth group of heat exchange fins mounted on said thermoelectric layer disposed in said second surface of said fourth module; means connected to said first group of heat exchange fins and to said fifth group of heat exchange fins for completing a current flow path through said thermopile; each of said modules having a passageway formed therein and extending generally parallel to said opposed surfaces of said modules, respectively; conduit means formed from insulating material connecting each of said passageways in series to form a single liquid flow path through said modules, whereby said modules remain electrically insulated from one another except along a path formed by said thermoelectric layers and said heat exchange means.

5. In a thermoelectric device, a pair of spaced modules formed from electrically and thermally conductive material, each of said modules having a pair of opposed surfaces, a layer of thermoelectric material secured to each of said surfaces of each of said modules, a first heat exchange means having a plurality of electrically conducting fins thereon secured to one of said layers of thermoelectric material disposed on one of said surfaces of one of said modules, a second heat exchange means including a plurality of electrically conducting fins thereon mounted in bridging relationship between that layer of thermoelectric material secured to the other of said surfaces of said one module and that layer of thermoelectric material secured to one of said sufaces of the other of said modules, a third heat exchange means having a plurality of electrically conducting fins thereon mounted on that layer of electric material located on the other of said surfaces of said other module, whereby a series current flow path is formed through said heat exchange means, said thermoelectric layers and said modules, each of said modules having a passageway formed therein and extending parallelly with respect to said opposed surfaces thereof, respectively, and conduit means formed from insulating material connecting said passageways in series.

6. In a thermoelectric device, a pair of spaced modules formed from electrically and thermally conductive material, each of said modules having a pair of opposed surfaces, a layer of thermoelectric material secured to each of said surfaces of each of said modules a first heat exchange means having a plurality of electrically conducting fins thereon secured to one of said layers of thermoelectric material disposed on one of said surfaces of one of said modules, a second heat exchange means including a plurality of electrically conducting fins thereon mounted in bridging relationship between that layer of thermoelectric material secured to the other of said surfaces of said one module and that layer of thermoelectric material secured to one of said surfaces of the other of said modules, a third heat exchange means having a plurality of electrically conducting fins thereon mounted on that layer of electric material located on the other of said surfaces of said other module, whereby a series current flow path is formed through said heat exchange means, said thermoelectric layers and said modules, each of said modules having a passageway formed therein and conduit means formed from insulating material connecting said passageways in series.

References Cited in the file of this patent

UNITED STATES PATENTS

| | | |
|---|---|---|
| 2,919,553 | Fritts | Jan. 5, 1960 |
| 3,016,715 | Pietsch | June 16, 1962 |
| 3,077,080 | Pietsch | Feb. 12, 1963 |
| 3,097,027 | Mims | July 9, 1963 |